United States Patent
Fay et al.

(10) Patent No.: US 11,848,299 B2
(45) Date of Patent: *Dec. 19, 2023

(54) EDGE-NOTCHED SUBSTRATE PACKAGING AND ASSOCIATED SYSTEMS AND METHODS

(71) Applicant: Micron Technology, Inc., Boise, ID (US)

(72) Inventors: Owen R. Fay, Meridian, ID (US); Madison E. Wale, Boise, ID (US); James L Voelz, Boise, ID (US); Dylan W. Southern, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/971,889

(22) Filed: Oct. 24, 2022

(65) Prior Publication Data

US 2023/0045144 A1 Feb. 9, 2023

Related U.S. Application Data

(63) Continuation of application No. 17/023,143, filed on Sep. 16, 2020, now Pat. No. 11,482,504.

(51) Int. Cl.
*H01L 23/00* (2006.01)
*H01L 25/18* (2023.01)
(Continued)

(52) U.S. Cl.
CPC .............. *H01L 24/48* (2013.01); *H01L 23/13* (2013.01); *H01L 25/0657* (2013.01);
(Continued)

(58) Field of Classification Search
CPC ......... H01L 23/13; H01L 24/48; H01L 24/13; H01L 24/16; H01L 24/49; H01L 25/0657;
(Continued)

(56) References Cited

U.S. PATENT DOCUMENTS 11,482,504 B2 * 10/2022 Fay ..................... H01L 23/13
2008/0042277 A1 2/2008 Lin
(Continued)

FOREIGN PATENT DOCUMENTS

CN 101826495 A 9/2010
CN 107611041 A 1/2018
(Continued)

OTHER PUBLICATIONS

CN Patent Application No. 202111072006.6—Chinese Office Action and Search Report, dated Dec. 14, 2022, with English Translation, 21 pages.
CN Patent Application No. 202111072006.6—Chinese Office Action, dated 28 Apr. 2023, with English Translation, 12 pages.
CN Patent Application No. 202111072006.6—Chinese Office Action, dated Aug. 23, 2023, with English Translation, 18 pages.

*Primary Examiner* — Jasmine J Clark
(74) *Attorney, Agent, or Firm* — Perkins Coie LLP

(57) ABSTRACT

Systems and methods for a semiconductor device having an edge-notched substrate are provided. The device generally includes a substrate having a front side, a backside having substrate contacts, and an inward notch at an edge of the substrate. The device includes a die having an active side attached to the front side of the substrate and positioned such that bond pads of the die are accessible from the backside of the substrate through the inward notch. The device includes wire bonds routed through the inward notch and electrically coupling the bond pads of the die to the substrate contacts. The device may further include a second die having an active side attached to the backside of the first die and positioned laterally offset from the first die such that the second bond pads are accessible by wire bonds around the edge of the first die and through the inward notch.

20 Claims, 6 Drawing Sheets

(51) Int. Cl.
*H01L 23/13* (2006.01)
*H01L 25/065* (2023.01)
*H01L 25/00* (2006.01)

(52) U.S. Cl.
CPC .............. *H01L 25/18* (2013.01); *H01L 25/50* (2013.01); *H01L 2224/4824* (2013.01); *H01L 2224/48105* (2013.01); *H01L 2225/0651* (2013.01); *H01L 2225/06562* (2013.01); *H01L 2225/06586* (2013.01); *H01L 2924/1515* (2013.01); *H01L 2924/182* (2013.01)

(58) Field of Classification Search
CPC ... H01L 2224/48105; H01L 2224/4824; H01L 2224/05647; H01L 2225/0651; H01L 2225/06562; H01L 2225/06586; H01L 2924/1515; H01L 2924/15311

USPC .................................................. 257/777, 783
See application file for complete search history.

(56) References Cited

U.S. PATENT DOCUMENTS

| | | |
|---|---|---|
| 2009/0045524 A1 | 2/2009 | Mohammed et al. |
| 2015/0102506 A1 | 4/2015 | Song et al. |
| 2018/0012829 A1 | 1/2018 | Mangrum |
| 2021/0343691 A1 | 11/2021 | Kang et al. |
| 2022/0084977 A1 | 3/2022 | Fay et al. |

FOREIGN PATENT DOCUMENTS

| | | |
|---|---|---|
| TW | 200802771 A | 1/2008 |
| TW | 201013874 A | 4/2010 |
| WO | 2018048450 | 3/2018 |

\* cited by examiner

EDGE-NOTCHED SUBSTRATE PACKAGING AND ASSOCIATED SYSTEMS AND METHODS

CROSS-REFERENCE TO RELATED APPLICATION(S)

This application is a continuation of U.S. patent application Ser. No. 17/023,143, filed Sep. 16, 2020, now U.S. Pat. No. 11,482,504, which is incorporated herein by reference in its entirety.

TECHNICAL FIELD

The present disclosure is generally directed to semiconductor devices, and in several embodiments, more particularly to systems and methods of packaging with an edge-notched substrate.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted.

Some semiconductor packages use a window-type substrate having an opening through a central region of the substrate. A die is mounted over the opening and bonding wires are routed from bond pads at the front side of the die through the opening to contacts at the backside of the substrate to electrically couple the die to the substrate. Window-type substrates typically enable short bonding wires, which increases efficiency and performance of signal transmission between the die and the substrate. After the wires are bonded, an encapsulant is applied to the window area to protect the bonding wires and connections on the die and substrate.

The backside of the window-type substrate can include ball grid array (BGA) surface-mount packaging, which is used to permanently mount the microelectronic device to another component. A BGA typically provides a greater interconnect density compared to other packaging configurations and the traces connecting the leads from the die to the balls are also generally short, leading to better performance at high speeds.

DETAILED DESCRIPTION

Figure 1A:
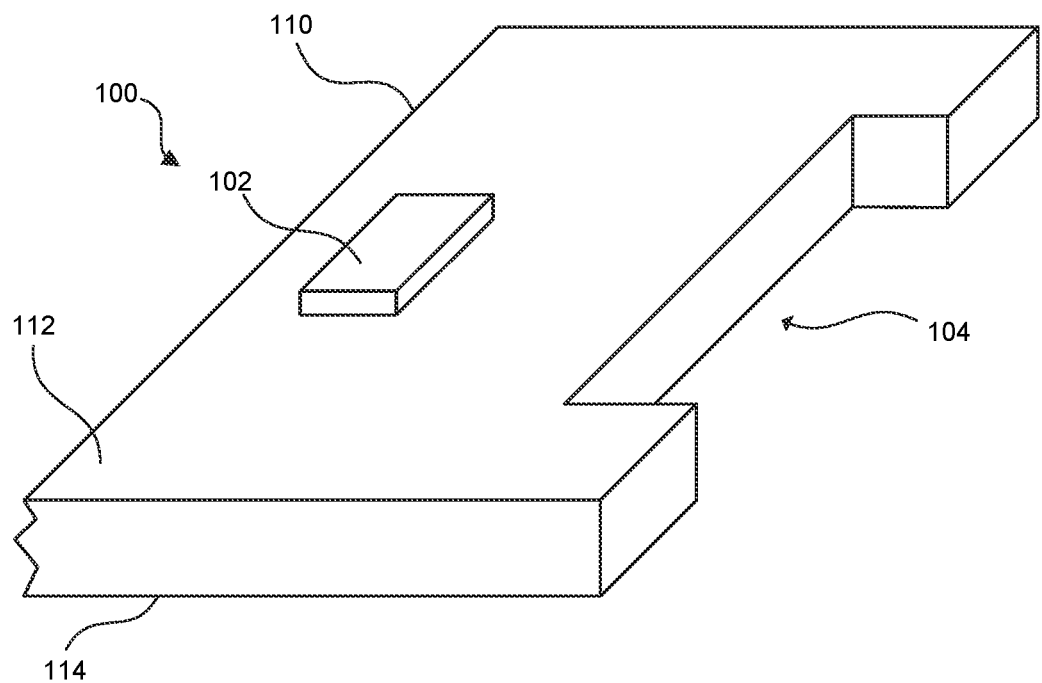
FIGS. 1A and 1B are perspective views showing various stages of assembly of a semiconductor device having an edge-notched substrate in accordance with embodiments of the present technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. In some embodiments, an individual semiconductor device may be "packaged" and include a molding material encasing the components and electrical connections in the device.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having an edge-notched substrate. The inward edge notch on the substrate is configured such that compact wire bonds can be routed from interconnect bond pads of a stack of dies to contacts on an opposite side of the edge-notch substrate. Conventional semiconductor device packaging uses wire loops routed on the top of the package to electrically couple the bond pads of the dies to the contacts on the side of the substrate to which the dies are mounted. These types of wire loops first extend upward from the bond pads of the die and then down to the substrate—a configuration which increases the overall height of the package after molding and may exceed the height limit for high volume manufacturing (HVM). Conventional window-type substrates have a central opening that can be used to eliminate the upward loop portion of the wire bonds; however, some dies, such as NAND memory dies, random access memory (e.g., phase-change RAM and LPDRAM), and others, have interconnect bond pads at the edge of the die and are incompatible for use with conventional window-type substrates.

The present technology is generally directed to a bonded semiconductor device having a package substrate with an edge-notch and a semiconductor die attached to the package substrate. The package substrate has a mounting surface to which the die is attached and an array surface with electrical contacts and solder pads opposite the mounting surface. The semiconductor die has an active side with bond pads attached to the mounting surface. The bond pads are at an edge of the die, and the die is positioned on the mounting surface such that the bond pads on the edge of the die are aligned with the edge notch for wire bond access from the bond pads to the array surface of the substrate. In a stacked configuration, the dies may be positioned laterally offset or stepped to allow access to the bond pads of each die in the stack. The wire bonds can be formed from the active side of the die, routed through the edge notch, and connected to contacts on the array surface of the substrate. This eliminates portions of the wire loop from extending upward or laterally past the envelop of the substrate and die combination. The semiconductor device can have an encapsulant encasing the die and the wire bonds by filling the edge notch, and this process can be performed in a single mold cavity. In some embodiments, the present technology reduces the package size of the semiconductor device after molding and decreases the average length of the wire bonds. Edge notches of the present technology can be configured to conform to existing industry standard layouts, including Joint Electron Device Engineering Council (JEDEC) BGA layouts, among others.

Figure 1B:
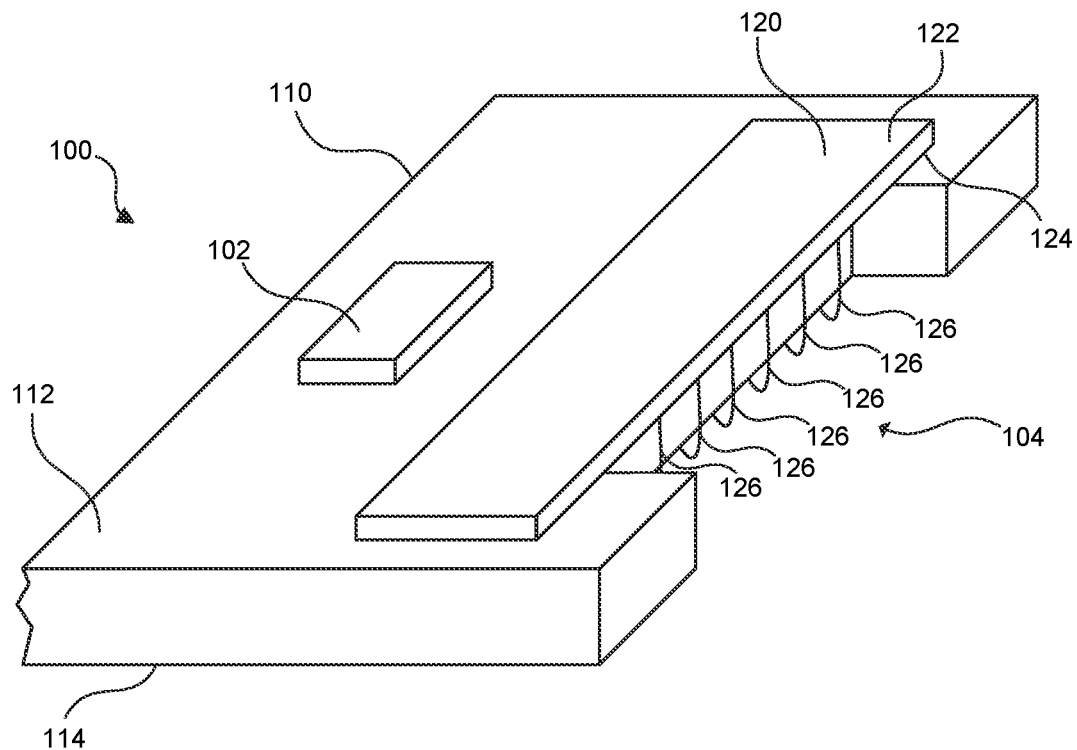
Figure 1C:
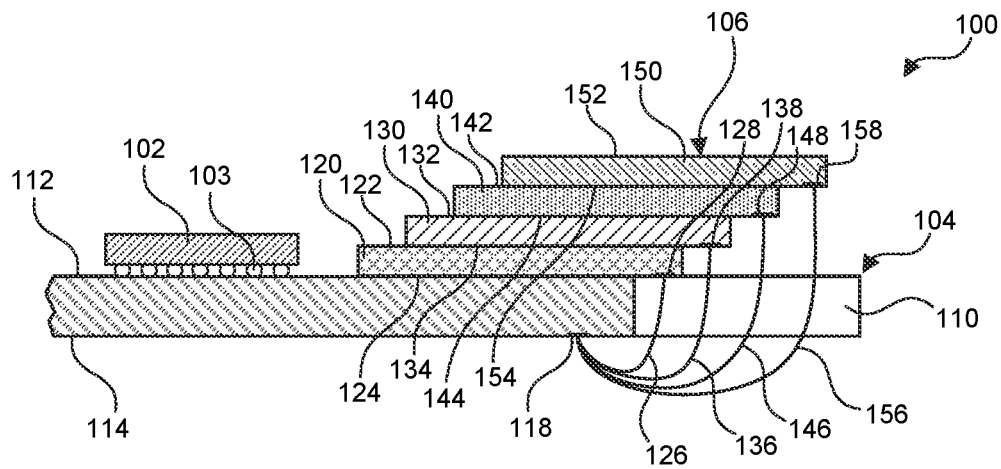
FIGS. 1C and 1D are enlarged cross-sectional views showing various stages of assembly of the semiconductor device of FIGS. 1A and 1B.
Figure 1D:
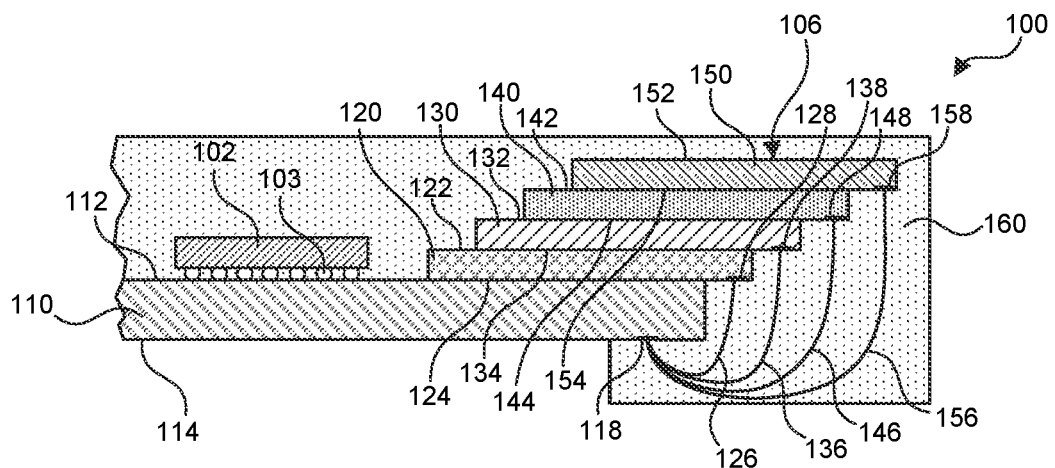
Figure 1E:
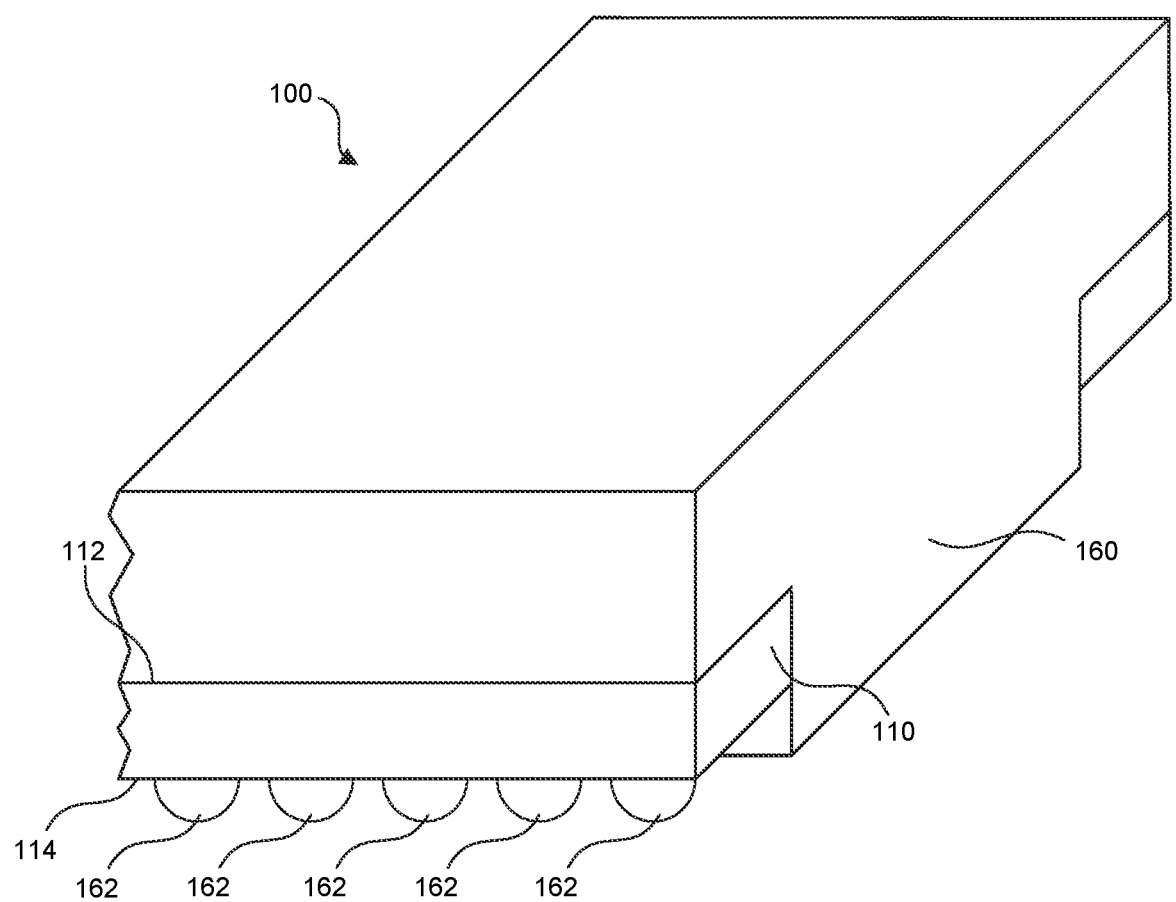
FIG. 1E is a perspective view showing a stage of assembly of the semiconductor device of FIGS. 1A and 1B.
Figure 2A:
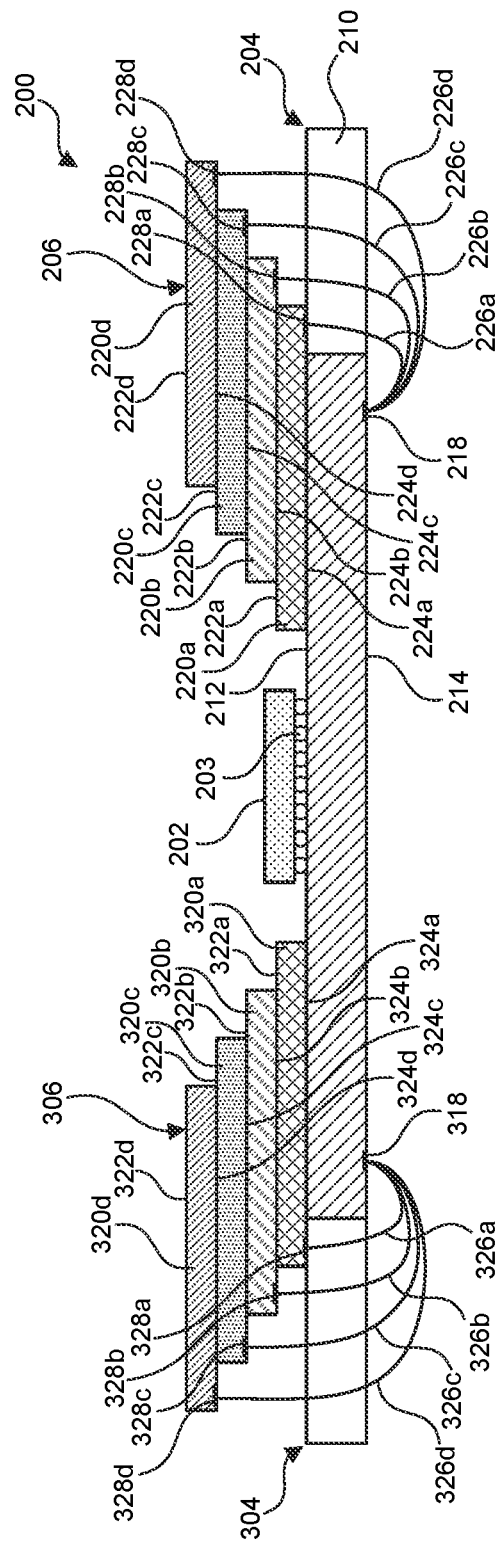
FIGS. 2A and 2B are enlarged cross-sectional views showing various stages of manufacturing a semiconductor device having an edge-notched substrate in accordance with embodiments of the present technology.
Figure 2B:
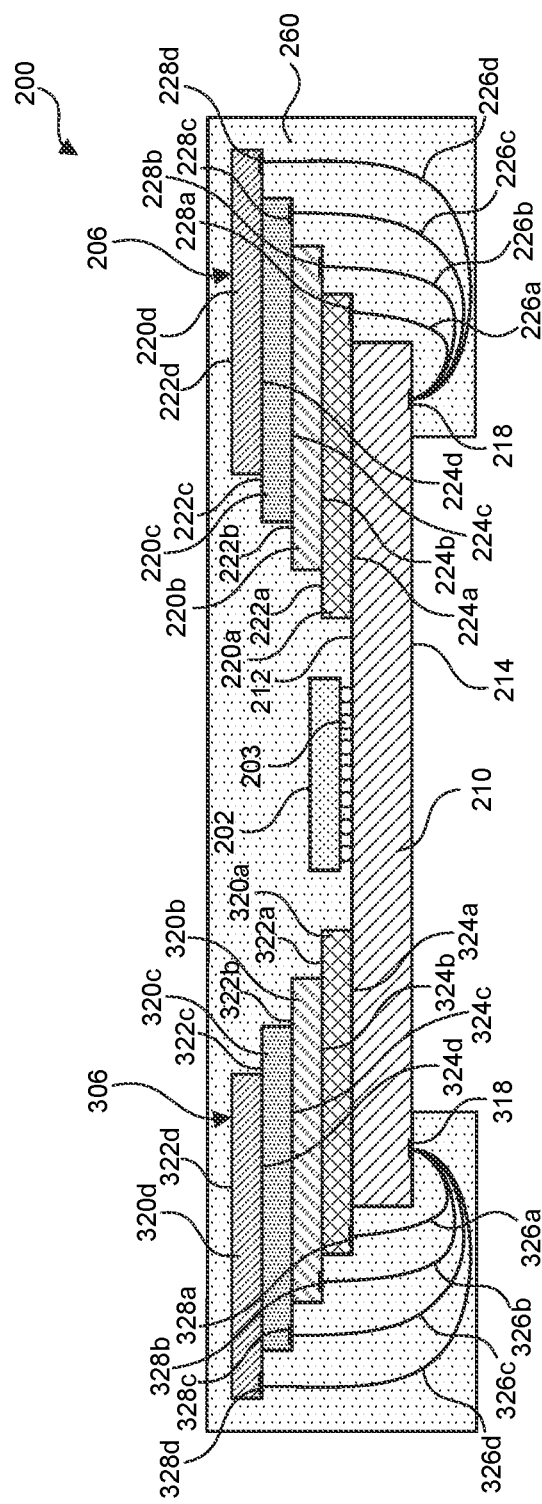

FIGS. 1A, 1B, and 1E show perspective views of a semiconductor device 100 ("device 100"), and FIGS. 1C and 1D show enlarged cross-sectional views of various stages of assembly of the device 100. The device 100 can be a memory array such as a stack of NAND memory dies, which may further include one or more logic dies. The device 100 includes a silicon substrate 110 having an inward notch ("notch 104"), a front side 112 (e.g., a mounting surface), and a backside 114 (e.g., an array surface). The substrate 110 is shown with a single notch 104 on one edge of the substrate; however, in other embodiments, the substrate 110 has any number of edges with notches (e.g., notches on two edges of the substrate, as shown in FIGS. 2A and 2B), or may include multiple notches per edge. The notch 104 can extend along any percentage of the edge length and have any depth into the substrate, which can depend on the number of dies in a stack 106, as will be described in greater detail below. Further, the notch 104 is shown with generally square corners and perpendicular faces, but may have any suitable shape, including angled faces, fillets, etc.

Referring to FIG. 1B, the device 100 has an optional microcontroller 102 (e.g., logic die) and a first die 120 attached to the front side 112 of substrate 110. The first die 120 includes a backside 122 and an active side 124 facing the front side 112 of the substrate 110. Referring to FIG. 1C, the microcontroller 102 is electrically coupled to the substrate 110 via interconnects 103, and the first die 120 has bond pads 128 along an edge of the first die 120. The first die 120 is positioned to partially overhang the notch 104 such that the bond pads 128 on the edge of the active side 124 of the first die 120 are exposed to receive wire bonds 126 and electrically couple the first die 120 to contacts 118 of the substrate 110. Although only a single bond pad 128 and a single contact 118 are shown in the cross-sectional view, the device 100 typically has a large number of bond pads 128 and contacts 118.

The die stack 106 can have a second die 130 including a backside 132, an active side 134 that is bonded in a laterally offset configuration to the backside 122 of the first die 120, and bond pads 138 on the active side 134. The second die 130 is positioned to partially overhang the first die 120 and the notch 104 such that the bond pads 138 on the edge of the active side 134 of the second die 130 are exposed to receive wire bonds 136 and electrically couple the second die 130 to the contacts 118 on the substrate 110. The die stack 106 can similarly include any number of additional dies, such as third and fourth dies 140 and 150. The third die 140 included a backside 142, an active side 144 bonded in a laterally offset configuration to the backside 132 of the second die 130, and bond pads 148 on the active side 144. The third die 140 is positioned to partially overhang the first and second dies 120 and 130 and the notch 104 such that the bond pads 148 on the edge of the active side 144 of the third die 140 are exposed to receive wire bonds 146 and electrically couple the third die 140 to the contacts 118 on the substrate 110. The fourth die 150 includes a backside 152, an active side 154 that is bonded in a laterally offset configuration to the backside 142 of the third die 140, and bond pads 158 on the active side 154. The fourth die 150 is positioned to partially overhang the first, second, and third dies 120, 130, and 140 and the notch 104 such that the bond pads 158 on the edge of the active side 154 of the fourth die 150 are exposed to receive wire bonds 156 and electrically couple the fourth die 150 to the contacts 118 on the substrate 110. Although four dies are shown in a stacked and laterally offset stepped configuration, in other embodiments, any number of dies packaged with the edge-notched substrate are within the scope of the present technology.

Referring to FIG. 1D, the device 100 can further include a packaging mold material 160 covering components of the device 100 after the dies 120, 130, 140, and 150 are bonded to the substrate 110 and electrically coupled to the substrate 110. The packaging mold material 160 is applied by flowing liquid mold material through a sprue (not shown) over the mounted components of the device 100 within the boundaries of a mold chase (not shown). A mold chase is configured to constrain the outer shape of the package and hold the form until the liquid mold material solidifies. The mold material 160 is first applied to the front side 112 of the substrate 110 and the dies 120, 130, 140, and 150, and then flows through the notch 104 to engulf, and thereby protect, the wire bonds 126, 136, 146, and 156 and the contacts 118 on the backside 114 of the substrate 110. In other embodiments, the mold material 160 is applied at any location to form the outer package shape of the device 100, such as through a lateral sprue, a bottom sprue, etc.

FIG. 1E shows the device 100 after encasing the microcontroller 102, the dies 120, 130, 140, and 150, etc., with the packaging mold material 160. The packaged device 100 can be electrically coupled to other components with an interconnect arrangement such as a ball grid array (BGA). The BGA is formed by attaching balls 162 (e.g., solder balls) to the backside 114 of the substrate 110 after the mold material 160 is solidified. The balls 162 may have a diameter such that the portion of the mold material 160 extending past the backside 114 is contained within the gap created by the size of the balls 162 between the device 100 and a mounting surface. Other interconnect configurations are also within the scope of the present technology, including pillars and other suitable interconnect structures.

FIGS. 2A and 2B show enlarged cross-sectional views of various stages of assembly of a semiconductor device 200 ("device 200"), e.g., a memory array, configured in accordance with embodiments of the present technology. The device 200 is similar in overall structure to the device 100 of FIGS. 1A-1E, but has a dual edge-notched substrate configuration with multiple die stacks. The device 200 is shown with like reference numbers referring to similar features in FIGS. 1A-1E, but are in the 200-series for a first side (right side of FIGS. 2A and 2B), and in the 300-series for a second side (left side of FIGS. 2A and 2B), and the features may have variations and/or have different shapes and sizes. The device 200 includes a silicon substrate 210 having a first inward notch ("first notch 204"), a second inward notch ("second notch 304"), a front side 212 (e.g., a mounting surface), and a backside 214 (e.g., an array surface). The device 200 may also include various other semiconductor components, e.g., a microcontroller 202 having interconnects 203, etc. In this configuration, the microcontroller 202 can be positioned in the center of the die stacks, which allows uniform trace length from the die stacks to the microcontroller.

Referring to FIG. 2A, the device 200 has a first die stack 206 proximate to the first notch 204 and a second die stack 306 proximate to the second notch 304 on an opposite edge of the substrate 210. The first die stack 206 includes first, second, third, and fourth dies 220a-d having backsides 222a-d and active sides 224a-d, respectively. The dies 220a-d are positioned to overhang the first notch 204 in a laterally offset, stepped configuration, similar to the die stack 106 of the device 100. The active sides 224a-d face toward the front side 212 of the substrate 210. Each active side 224a-d is laterally offset to partially overhang the first notch 204 such that bond pads 228a-d on the edges of the active sides, 224a-d are exposed to receive wire bonds 226a-d, respectively, to electrically couple the dies 220a-d to contacts 218 of the substrate 210.

The second die stack 306 includes first, second, third, and fourth dies 320a-d having backsides 322a-d and active sides 324a-d, respectively. The dies 320a-d are positioned to overhang the second notch 304 in a laterally offset, stepped configuration, similar to, but mirror symmetrical from the die stack 106 of the device 100. The active sides 324a-d of the dies 320a-d face toward the front side 212 of the substrate 210. Each active side 324a-d is laterally offset to partially overhang the second notch 304 such that bond pads 328a-d on the edges of the active sides 324a-d are exposed to receive wire bonds 326a-d, respectively, to electrically couple the dies 320a-d to contacts 318 of the substrate 210. Although four dies are shown in each of the first and second die stacks 206 and 306 in the laterally offset stepped configuration, in other embodiments, any number of dies are arranged in the stack to be packaged with the edge-notched substrate, and are also within the scope of the present technology.

Referring to FIG. 2B, the device 200 includes a packaging mold material 260 encasing the components of the device 200 after the die stacks 206 and 306 have been bonded and electrically coupled to the substrate 210, as described above. The packaging mold material 260 is applied by flowing liquid mold material through a sprue (not shown) over the mounted components of the device 200 within the boundaries of a mold chase (not shown). The mold chase is configured to constrain the outer shape of the package and hold the form until the liquid mold material solidifies. The mold material 260 is first applied to the front side 212 of the substrate 210 and to the die stacks 206 and 306, and then flows through the first and second notches 204 and 304 to engulf, and thereby protect, the wire bonds 226a-d and 326a-d and the contacts 218 and 318 of the substrate 210 on the backside 214. In other embodiments, the mold material 260 is applied at any location to form the package, such as through a lateral sprue, a bottom sprue, etc. Although not shown in the Figures, the device 200 can be electrically coupled to other components with a BGA similar to that shown in FIG. 1E. Other interconnect configurations are also within the scope of the present technology, including pillars and other suitable interconnect structures. Although one exemplary configuration of the device 200 is depicted in FIGS. 2A-2B, any suitable configuration of device is also within the scope of the present technology, e.g., three or four notches and corresponding die stacks, multiple die stacks on the same edge with one or more notches per edge, etc.

The interconnects described herein may be formed from suitable conductive materials, such as copper (Cu), and may have solder caps to form the electrical connections (e.g., tin-silver (SnAg) solder caps). During assembly, the solder cap can be reflowed using gang reflow, sonic reflow, or other techniques. The bond pads can be copper pads and may be bonded using copper-to-copper bonding or other suitable techniques.

Figure 3:
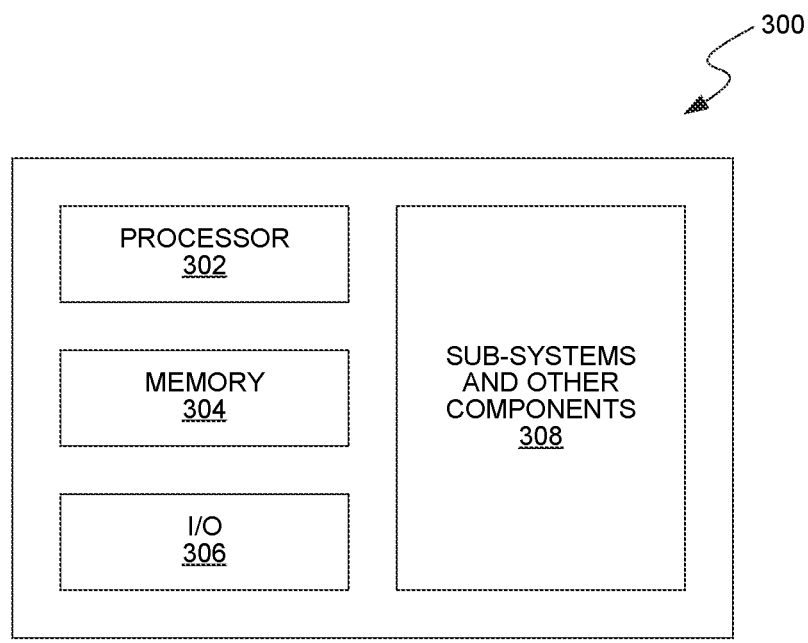
FIG. 3 is a schematic view of a system that includes a semiconductor device in accordance with embodiments of the present technology.

FIG. 3 is a block diagram illustrating a system that incorporates a semiconductor device in accordance with embodiments of the present technology. Any one of the semiconductor devices having the features described above with reference to FIGS. 1A-2B can be incorporated into any of a myriad of larger and/or more complex systems, a representative example of which is system 300 shown schematically in FIG. 3. The system 300 can include a processor 302, a memory 304 (e.g., SRAM, DRAM, flash, and/or other memory devices), input/output devices 306, and/or other subsystems or components 308. The semiconductor assemblies, devices, and device packages described above with reference to FIGS. 1A-2B can be included in any of the elements shown in FIG. 3. The resulting system 300 can be configured to perform any of a wide variety of suitable computing, processing, storage, sensing, imaging, and/or other functions. Accordingly, representative examples of the system 300 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 300 include lights, cameras, vehicles, etc. In these and other examples, the system 300 can be housed in a single unit or distributed over multiple interconnected units, e.g., through a communication network. The components of the system 300 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device assembly, comprising:
    a substrate, the substrate having a front side, a backside having substrate contacts, and an inward notch at an edge of the substrate;
    a die having a surface attached to the front side of the substrate, the die having bond pads on the surface overlapping the inward notch; and
    wire bonds extending through the inward notch and electrically coupling the bond pads of the die to the substrate contacts.

2. The semiconductor device assembly of claim 1, wherein the die comprises a first die having first bond pads and the wire bonds comprise first wire bonds electrically coupling the first bond pads to the substrate contacts, the semiconductor device assembly further comprising:
    a second die having a surface attached to the first die, the second die having second bond pads on the surface exposed by the first die and overlapping the inward notch; and
    second wire bonds extending through the inward notch and electrically coupling the second bond pads to the substrate contacts.

3. The semiconductor device assembly of claim 2, further comprising a mold material covering the first and second dies, the first and second wire bonds, and at least partially filling the inward notch.

4. The semiconductor device assembly of claim 2, further comprising a third die having a surface attached to the second die, wherein the third die has third bond pads on the surface exposed by the first and second dies and overlapping the inward notch.

5. The semiconductor device assembly of claim 4, further comprising third wire bonds extending through the inward notch and electrically coupling the third bond pads to the substrate contacts.

6. The semiconductor device assembly of claim 5, further comprising a fourth die having a surface attached to the third die, wherein the fourth die has fourth bond pads on the surface exposed by the first, second, and third dies and overlapping the inward notch.

7. The semiconductor device assembly of claim 6, further comprising fourth wire bonds extending through the inward notch and electrically coupling the fourth bond pads to the substrate contacts.

8. The semiconductor device assembly of claim 1, further comprising interconnects bonded to the backside of the substrate and electrically coupled to the first die through the first wire bonds.

9. The semiconductor device assembly of claim 8, wherein the interconnects comprise a ball grid array.

10. A semiconductor device assembly, comprising:
    a substrate having a front side, a backside having first substrate contacts and second substrate contacts, a first inward notch at a first edge of the substrate, and a second inward notch at a second edge of the substrate opposite the first edge;
    a first die having a surface attached to the front side of the substrate, the first die having first bond pads on the surface overlapping the first inward notch;
    a second die having a surface attached to the front side of the substrate, the second die having second bond pads on the surface overlapping the second inward notch;
    first wire bonds extending through the first inward notch and electrically coupling the first bond pads to the first substrate contacts; and
    second wire bonds extending through the second inward notch and electrically coupling the second bond pads to the second substrate contacts.

11. The semiconductor device assembly of claim 10, further comprising:
    a third die having a surface attached to the first die, the third die having third bond pads on the surface exposed by the first die and overlapping the first inward notch;
    a fourth die having a surface attached to the second die, the fourth die having fourth bond pads on the surface exposed by the second die and overlapping the second inward notch;
    third wire bonds extending through the first inward notch and electrically coupling the third bond pads to the first substrate contacts; and
    fourth wire bonds extending through the second inward notch and electrically coupling the fourth bond pads to the second substrate contacts.

12. The semiconductor device assembly of claim 10, further comprising a mold material covering the first and second dies, the first and second wire bonds, and at least partially filling the first and second inward notches.

13. The semiconductor device assembly of claim 10, further comprising interconnects bonded to the backside of the substrate and electrically coupled to the first die through the first wire bonds and to the second die through the second wire bonds.

14. The semiconductor device assembly of claim 13, wherein the interconnects comprise a ball grid array.

15. A semiconductor device packaging method, comprising:
    forming an inward notch on an edge of a substrate, the substrate having a front side and a backside having substrate contacts;
    attaching a surface of a die on the front side of the substrate such that bond pads on the surface of the die overlap the inward notch; and electrically coupling the bond pads of the die to the substrate contacts with wire bonds extending through the inward notch.

16. The method of claim 15, wherein the die comprises a first die having first bond pads and the wire bonds comprise first wire bonds electrically coupling the first bond pads to the substrate contacts, the method further comprising:
    attaching a surface of a second die on the first die in a laterally offset position such that second bond pads on the surface of the second die are exposed by the first die and overlap the inward notch; and
    electrically coupling the second bond pads to the substrate contacts with second wire bonds extending through the inward notch.

17. The method of claim 16, wherein the substrate contacts comprise first substrate contacts and the inward notch comprises a first inward notch on a first edge of the substrate, the method further comprising:
    forming a second inward notch on a second edge of the substrate, the substrate having second substrate contacts on the backside;
    attaching a surface of a third die on the front side of the substrate such that third bond pads on the surface of the third die overlap the second inward notch; and
    electrically coupling the third bond pads to the second substrate contacts with third wire bonds extending through the second inward notch.

18. The method of claim 17, further comprising:
    attaching a surface of a fourth die on the third die in a laterally offset position such that fourth bond pads on the surface of the fourth die are exposed by the third die and overlap the second inward notch; and
    electrically coupling the fourth bond pads to the second substrate contacts with fourth wire bonds extending through the second inward notch.

19. The method of claim 15, further comprising applying a mold material over the die, the wire bonds, and at least partially filling the inward notch.

20. The method of claim 19, further comprising bonding interconnects to the backside of the substrate and electrically coupling the interconnect to the die through the wire bonds.

* * * * *